(12) United States Patent
Park

(10) Patent No.: US 9,112,216 B2
(45) Date of Patent: Aug. 18, 2015

(54) APPARATUS AND METHOD FOR MANAGING BATTERY PACK

(75) Inventor: Kyu-Ha Park, Seoul (KR)

(73) Assignee: LG CHEM, LTD., Seoul (KR)

( * ) Notice: Subject to any disclaimer, the term of this patent is extended or adjusted under 35 U.S.C. 154(b) by 330 days.

(21) Appl. No.: 13/552,116

(22) Filed: Jul. 18, 2012

(65) Prior Publication Data

US 2012/0280692 A1 Nov. 8, 2012

(30) Foreign Application Priority Data

Jan. 7, 2011 (KR) ........................ 10-2011-0001688

(51) Int. Cl.
| | |
|---|---|
| *G01N 27/416* | (2006.01) |
| *H01M 2/20* | (2006.01) |
| *H01M 10/42* | (2006.01) |

(52) U.S. Cl.
CPC ...... *H01M 2/206* (2013.01); *H01M 2010/4271* (2013.01)

(58) Field of Classification Search
CPC .................................................. G01R 31/3648
USPC ........................................................ 324/426
See application file for complete search history.

(56) References Cited

U.S. PATENT DOCUMENTS

| | | | | |
|---|---|---|---|---|
| 6,133,709 | A | * | 10/2000 | Puchianu ...................... 320/116 |
| 7,498,774 | B2 | * | 3/2009 | Ziegler et al. ................. 320/150 |
| 2003/0108789 | A1 | | 6/2003 | Yamakawa et al. |
| 2005/0035737 | A1 | | 2/2005 | Elder et al. |
| 2010/0309949 | A1 | * | 12/2010 | Akaboshi et al. ............... 374/45 |

FOREIGN PATENT DOCUMENTS

| | | |
|---|---|---|
| JP | 9-199107 A | 7/1997 |
| JP | 9-306468 A | 11/1997 |
| JP | 2003-123734 A | 4/2003 |
| JP | 2004-265840 A | 9/2004 |
| KR | 10-2006-0084846 A | 7/2006 |
| KR | 10-2008-0102547 A | 11/2008 |

\* cited by examiner

*Primary Examiner* — Edward Tso
*Assistant Examiner* — Ahmed Omar
(74) *Attorney, Agent, or Firm* — Birch, Stewart, Kolasch & Birch, LLP

(57) ABSTRACT

The present invention discloses an apparatus and method for managing a battery pack, which can rapidly and accurately diagnose the coupling state of a bus bar to battery modules in the battery pack. In accordance with the present invention, provided is an apparatus for managing a battery pack having a plurality of battery modules and a bus bar coupled between the battery modules to electrically connect the battery modules, the apparatus comprising a coupling detection unit for detecting the coupling state of the bus bar to the battery modules; and a controlling unit for determining whether the coupling state of the bus bar has a defect on the basis of the coupling state detected by the coupling detection unit.

20 Claims, 3 Drawing Sheets

APPARATUS AND METHOD FOR MANAGING BATTERY PACK

CROSS-REFERENCE TO RELATED APPLICATION

This application is a continuation of International Application No. PCT/KR2011/009953 filed on Dec. 21, 2011, which claims priority to Korean Patent Application No. 10-2011-0001688 filed in the Republic of Korea on Jan. 7, 2011, the entire contents disclosed in the specification and drawings of which are incorporated herein by reference.

TECHNICAL FIELD

The present invention relates to a technology for managing a battery pack, and more particularly, to an apparatus and method for managing the battery pack which can detect whether or not there is a defect in the coupling state of a bus bar coupled between a plurality of battery modules comprised in the battery pack.

BACKGROUND ART

Recently, with the rapid increase in the demand for portable electronic products such as notebooks, video cameras and cellular phones and the development of energy storage batteries, robots, satellites, etc. under active progress, numerous studies are being made on high-performance secondary batteries capable of being repeatedly charged and discharged.

Currently, nickel-cadmium batteries, nickel-hydrogen batteries, nickel-zinc batteries, lithium secondary batteries or the like are commercially available as secondary batteries. Among these, lithium secondary batteries are at the center of interest because they hardly have memory effects and can be freely charged or discharged in comparison with nickel-based secondary batteries. Advantageously, the lithium secondary batteries also exhibit very low self-discharge rate and high energy density.

Meanwhile, with the gradual exhaustion of carbon energies and the increased interest in the environment, the demands for hybrid and electric vehicles are increasing all around the world, including U.S.A, Europe, Japan and Korea. The hybrid or electric vehicles obtain driving force by means of energy charged and discharged in a battery pack, thereby eliminating or reducing an exhausted pollutant while ensuring excellent fuel efficiency compared to only engine-driven vehicles. Thus, the hybrid or electric vehicles better appeal to many consumers. Accordingly, the battery which is the most fundamental part in such hybrid or electric vehicles is the focus of many interests and studies.

The battery pack, particularly the battery pack used in electric vehicles has a plurality of battery modules to output high voltage, and the battery modules are connected by a connecting member called a bus bar. The bus bar should be strongly coupled with the battery modules therebetween so as to carry out electrical connection between the battery modules. Accordingly, the bus bar is coupled to the battery modules by a connecting member such as a bolt, nut or the like, and its coupling state is securely sustained.

However, since battery packs are generally used in devices and apparatuses that have frequent movement, there is a chance that the coupling state of the bus bar to the battery modules in the battery pack will loosen. For example, in the case of an electric vehicle in operation, the bus bar can loosen from the battery modules which will weaken the coupling state of the bus bar to the battery modules due to the impact and vibration applied to the battery pack. Furthermore, the loose coupling state of the bus bar only worsens over time, and unless artificially repaired, will not get any better.

Meanwhile, as the coupling state of the bus bar to the battery modules in the battery pack worsens, the resistance of the bus bar may increase causing the energy loss of the battery pack and heat generation, thereby leading to the overall temperature rise of the battery pack. This temperature rise of the battery pack may cause the performance degradation of the battery pack, as well as, in a severe case, the ignition or explosion thereof, which may induce a great problem on the stability of the battery pack.

DISCLOSURE

Technical Problem

The present invention is designed to solve the problems of the prior art, and therefore, it is an aspect of the present invention to provide an apparatus and method for managing a battery pack, which can rapidly and accurately detect the coupling state of a bus bar to battery modules in the battery pack.

Additional aspects and advantages will be apparent from the embodiments of the present invention. The aspects and advantages of the invention may be realized by means of instrumentalities and combinations particularly pointed out in the appended claims.

Technical Solution

In order to accomplish the above object, the present invention provides an apparatus for managing a battery pack having a plurality of battery modules and a bus bar coupled between the battery modules to electrically connect the battery modules, the apparatus comprising a coupling detection unit for detecting the coupling state of the bus bar to the battery modules; and a controlling unit for determining whether the coupling state of the bus bar has a defect on the basis of the coupling state detected by the coupling detection unit.

Preferably, the coupling detection unit comprises a pressure sensor.

Also, the apparatus for managing a battery pack according to the present invention may further comprise a warning unit for providing information on the coupling defect of the bus bar, which is determined by the controlling unit, to a user.

Preferably, the controlling unit comprises a battery management system (BMS).

In addition, in order to accomplish the above object, the present invention provides a battery pack comprising the above battery pack managing apparatus.

Also, in order to accomplish the above object, the present invention provides a vehicle comprising the above battery pack managing apparatus.

Further, in order to accomplish the above object, the present invention provides a method for managing a battery pack having a plurality of battery modules and a bus bar coupled between the battery modules to electrically connect the battery modules, which comprises the steps of detecting the coupling state of the bus bar and determining whether the coupling state of the bus bar has a defect on the basis of the coupling state of the bus bar detected.

Preferably, the coupling state of the bus bar is detected by a pressure sensor.

In addition, the method for managing a battery pack according to the present invention may further comprise the step of informing a user that the coupling state of the bus bar has a defect, when the coupling state of the bus bar is determined to have a defect.

Furthermore, the determination whether the coupling state of the bus bar has a defect may be conducted by a BMS.

Advantageous Effects

In accordance with the present invention, the coupling state of a bus bar by which a plurality of battery modules comprised in a battery pack are connected with each other can be rapidly and accurately determined. Particularly, in the case of a battery pack used in electric vehicles, the bus bar may weaken due to a lot of impact and vibration applied to the battery pack and exposure to rapid changes in temperature. However, according to the present invention, a defect of the coupling state of a bus bar can be easily detected.

Accordingly, a user can rapidly and accurately check a suitable time for repairing or exchanging the bus bar from the coupling state information of the bus bar and take suitable action.

Thus, the apparatus and method of the present invention can be used to prevent energy loss and heat generation in a battery pack due to the coupling defect of the bus bar, as well as the deformation of the bus bar or the performance degradation or explosion of the battery pack, which results from the heat generation due to the coupling defect of the bus bar.

Particularly, in accordance with one embodiment of the present invention, when the bus bar has a coupling defect, the flow of an electric current can be interrupted to stop the use of the battery pack, thereby enhancing the stability of the battery pack.

DESCRIPTION OF THE DRAWINGS

The accompanying drawings illustrate preferred embodiments of the present disclosure and, together with the foregoing disclosure, serve to provide further understanding of the technical spirit of the present disclosure. However, the present disclosure is not to be construed as being limited to the drawings.

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
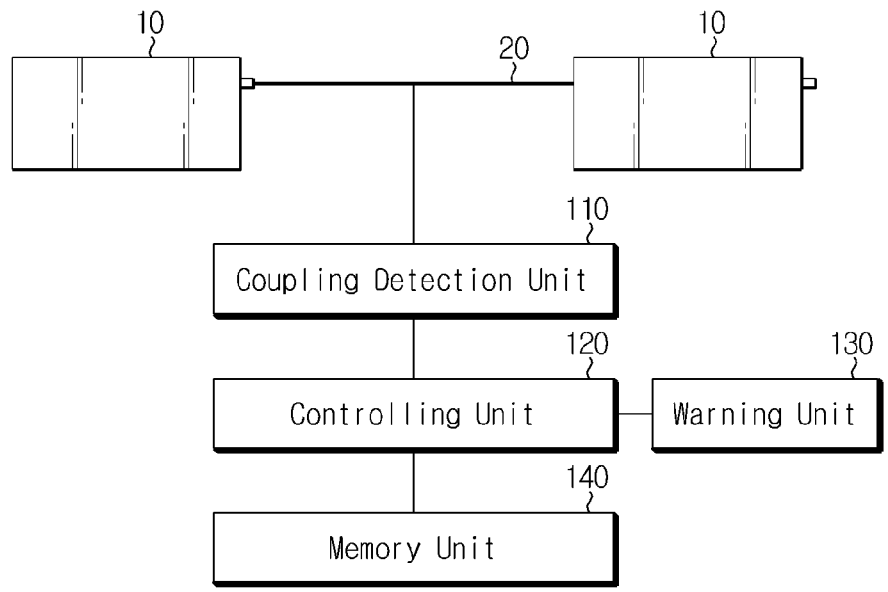
FIG. 1 is a block diagram schematically showing a functional configuration of an apparatus for managing a battery pack having battery modules and a bus bar according to one embodiment of the present invention.

FIG. 1 is a block diagram schematically showing a functional configuration of an apparatus for managing a battery pack having battery modules 10 and a bus bar 20 according to one embodiment of the present invention. Referring to FIG. 1, the battery pack managing apparatus of the present invention comprises a coupling detection unit 110 and a controlling unit 120.

The battery pack may comprise a plurality of battery modules 10, particularly in the case of a middle- or large-sized battery pack requiring high voltage, such as a battery pack for electric vehicles, even more battery modules 10 are comprised. Each battery module 10 has a positive and negative electrode socket for the input/output of electric current.

The battery modules 10 are coupled with a bus bar 20 positioned therebetween. The battery modules 10 and the bus bar 20 may be coupled by various means, e.g., a coupling member such as bolts and nuts.

The bus bar 20 is a component for allowing the battery modules 10 to electrically connect with each other, and so may be made of materials having good electrical conductivity such as copper. The bus bar 20 may be made in various forms depending on the inner structure of the battery pack, the connection state of the battery modules, etc. For example, the bus bar 20 may be in the form of a metal plate or a wire. Thus, the bus bar 20 used herein means a component for allowing a plurality of the battery modules 10 to electrically connect with each other by being coupled with each of the battery modules 10, and it is not limited to its form and denomination.

The coupling detection unit 110 detects the coupling state of the battery modules 10 and the bus bar 20. That is, whether the bus bar 20 is well-coupled to the battery modules 10 or whether it has loosened therefrom. The detection by the coupling detection unit 110 may be conducted in various manners.

Preferably, the coupling detection unit 110 may comprise a pressure sensor. Specifically, the coupling detection unit 110 can detect the coupling state of the bus bar 20 to the battery modules 10 through the pressure sensor.

Figure 2:
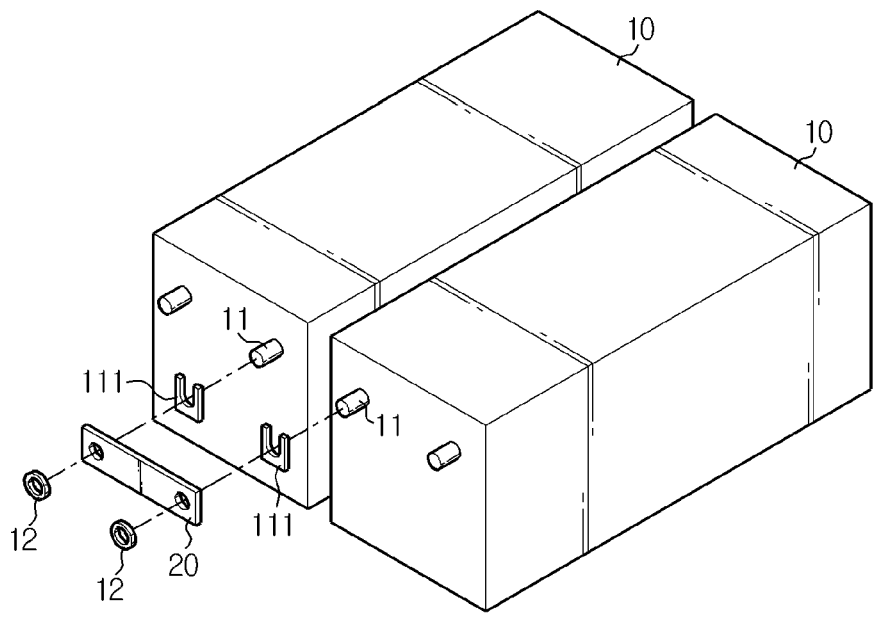
FIG. 2 is a perspective view schematically showing a separated-configuration for detecting the coupling state of a bus bar by a pressure sensor according to one embodiment of the present invention.
Figure 3:
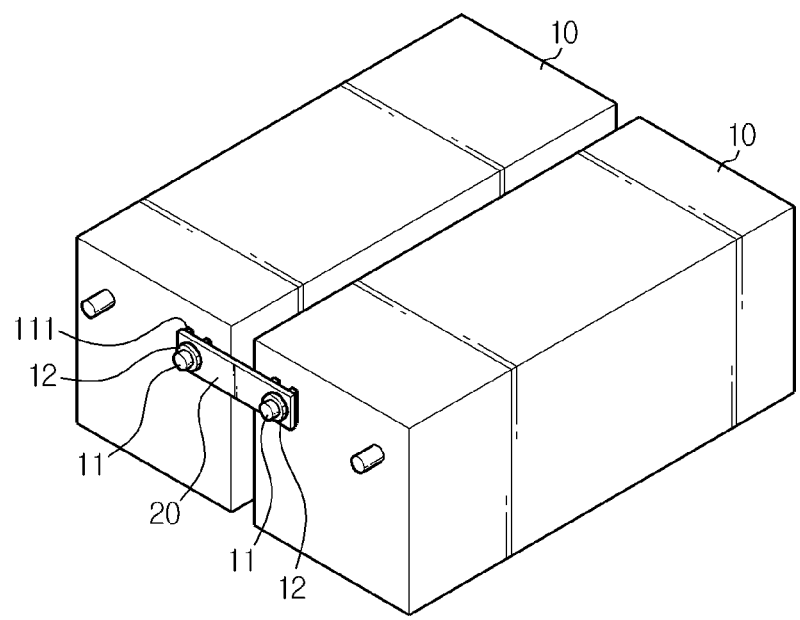
FIG. 3 is a perspective view schematically showing a combined-configuration of FIG. 2.

FIG. 2 is a perspective view schematically showing a separated-configuration for detecting the coupling state of a bus bar by a pressure sensor according to one embodiment of the present invention, and FIG. 3 is a perspective view schematically showing a combined-configuration of FIG. 2. Also, FIG. 4 is a view seeing the coupling region of the bus bar shown in FIG. 3 from top to bottom of the battery module.

Figure 4:
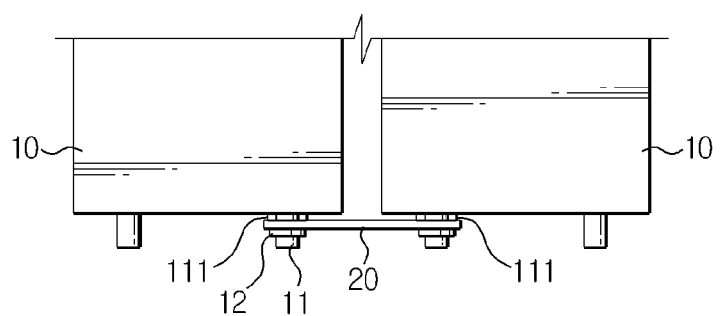
FIG. 4 is a view seeing the coupling region of a bus bar from top to bottom of the battery module.

Referring to FIGS. 2 to 4, the bus bar 20 is coupled with two battery modules therebetween, and thus the battery modules 10 are electrically connected through the bus bar 20. At this time, the battery modules 10 may have bold-shaped electrode sockets 11 by which the bus bar 20 is coupled together with nuts 12. However, the coupling of the battery modules 10 and the bus bar 20 may be conducted in various forms, and the present invention is not limited to any specific coupling form thereof.

Meanwhile, a pressure sensor 111 may be provided between the bus bar 20 and the battery modules 10. The pressure sensor 111 may function as a coupling detection unit 110 for detecting the coupling state of the bus bar 20 to the battery modules 10. As shown in the drawings, the bus bar 20 is coupled with the battery modules 10 by means of a coupling member such as nuts, and the pressure sensor 111 may be applied with some extent of pressure in a normal state. However, if any variation on the coupling state of the bus bar 20 to the battery modules 10 occurs, the pressure sensor 111 may undergo the change of the pressure applied thereto. For example, in the embodiments of FIGS. 3 and 4, when the nuts 12 become loose, the pressure applied to the pressure sensor 111 is reduced and thus the pressure detected thereby is also decreased. Thus, the pressure sensor 111 provided in the coupling region between the bus bar 20 and the battery modules 10 may measure a pressure to detect any variation on the coupling state of the bus bar 20. At this time, it is preferred that the pressure sensor 111 is a thin film-type pressure sensor having a thin thickness. As shown in drawings, the pressure sensor 111 may be interposed between the bus bar 20 and the battery modules 10. Therefore, if the thickness of the pressure sensor 111 is too thick, this may restrict the bus bar 20 to tightly couple to the battery modules 10. Accordingly, it is preferred that the pressure sensor 111 has a thin-film type as thin as paper or an ultra thin film-type. The present invention is, however, not limited to any specific type of the pressure sensor 111, and the various types of the pressure sensor may be used.

Preferably, the coupling detection unit 110 may also comprise a voltage sensor. That is, the coupling detection unit 110 may measure the voltage change on both ends of the bus bar 20 through the voltage sensor to detect the coupling state of the bus bar 20.

Figure 5:
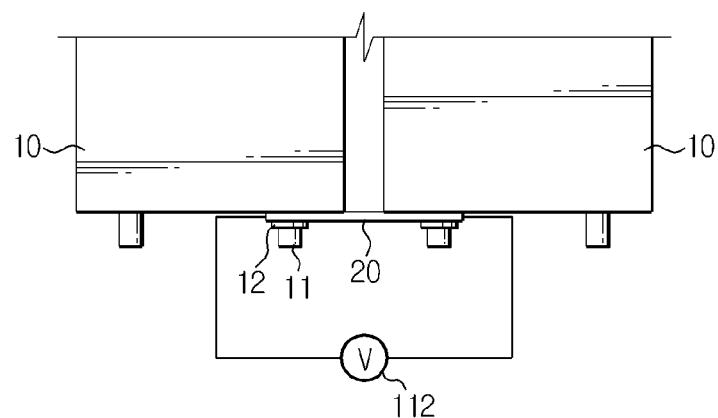
FIG. 5 schematically shows a configuration for detecting the coupling state of a bus bar by a voltage sensor according to one embodiment of the present invention.

FIG. 5 schematically shows a configuration for detecting the coupling state of a bus bar 20 by a voltage sensor 112 according to one embodiment of the present invention.

Referring to FIG. 5, the voltage sensor 112 is provided on both ends of the bus bar 20 coupled between two battery modules 10, thereby being capable of measuring the current of both ends of the bus bar 20. In a normal state, the bus bar 20 has a constant resistance and current and it will most likely show no observable voltage change on both ends thereof. However, when the coupling state between the bus bar 20 and the battery modules 10 is loosened, for example, by means of loose nuts 12, the resistance of the bus bar 20 may be increased. At this time, an increase in the resistance of the bus bar 20 means an increase in the voltage of both ends of the bus bar 20 since there will be no changes in the current flow of the bus bar 20. Therefore, the voltage sensor 112 can detect the coupling state of the bus bar to the battery modules 10 by measuring the voltage of both ends of the bus bar 20.

Meanwhile, the detection for the coupling state of the bus bar 20 by means of the coupling detection unit 110 may be continuously or discontinuously conducted. For example, the pressure sensor 111 may continuously or periodically detect a pressure applied from the bus bar 20.

The controlling unit 120 determines the occurrence of a defect in the coupling state of the bus bar 20 on the basis of the results obtained by the coupling detection unit 110, that is, any variation on the coupling state of the bus bar 20 which is detected by means of the coupling detection unit 110.

Preferably, in the case that the coupling detection unit 110 is the pressure sensor 111 as shown in FIGS. 2 to 4, the controlling unit 120 may determine the occurrence of a defect in the coupling state of the bus bar 20 when a pressure detected by the pressure sensor 111 is lower than a reference pressure. Here, the reference pressure means a pressure value which can be detected by the pressure sensor 111 in the normal coupling state of the bus bar 20 to the battery modules 20. At this time, like a battery of an electric vehicle, since impact and vibration may be applied to a battery pack to some extent, although there might not be any observable effects in the coupling state of the bus bar 20, the pressure value detected by the pressure may change a bit. Accordingly, the reference pressure may have a value of a certain range, not a specific value.

For more specific consideration, assuming that the reference pressure for a comparison with a voltage detected by the pressure sensor 111 ranges from 10 to 30 kg/cm$^2$, the controlling unit 120 may determine the coupling state of the bus bar to have no observable defect when the voltage detected by the pressure sensor 111 is from 10 to 30 kg/cm$^2$. However, if the voltage detected by the pressure sensor 111 is lower than 10 kg/cm$^2$, the lower limit of the reference pressure, the bus bar may be determined to have a coupling defect. The looseness of the bus bar 20 reduces a pressure applied to the pressure sensor 111, so the controlling unit 120 may determine the coupling state of the bus bar to have a defect on the basis of the looseness.

Preferably, if the controlling unit 120 comprises a voltage sensor 112 as shown in FIG. 5, a defect occurrence in the coupling state of the bus bar 20 may be checked by a voltage detected by the voltage sensor 112. That is, the controlling unit 120 can calculate the resistance of the bus bar 20 by using a voltage detected by the voltage sensor 112 and a current flowing through the bus bar 20. At this time, the current flowing through the bus bar 20 may be separately measured through a current sensor, or may be a predetermined value. Then, if the calculated resistance is higher than a reference resistance, the controlling unit 120 may determine a defect in the coupling state of the bus bar by comparing the resistance calculated with the reference resistance.

For example, in the condition that the reference resistance ranges from 50 to 70Ω and a 10 A current flows in the bus bar, if the voltage of both ends of the bus bar 20 is detected to have a 600 V value by the voltage sensor 112, the controlling unit 120 may calculate the resistance of the bus bar 20 to be 60Ω (600 V/10 A). Thus, since the resistance calculated of the bus bar 20 is within the range of the reference resistance value, the controlling unit 120 may determine no defect in the coupling state of the bus bar 20 to the battery modules 10. However, if the voltage of both ends of the bus bar 20 is detected to have a 800 V value by the voltage sensor 112, the controlling unit 120 may calculate the resistance of the bus bar 20 to be 80Ω (800 V/10 A). This resistance of the bus bar 20 is higher than the reference value, so the controlling unit 120 may determine a defect in the coupling state of the bus bar 20. This is because the resistance of the bus bar 20 increases if the coupling of the bus bar 20 weakens and becomes loose.

Meanwhile, the controlling unit 120 may also determine whether the coupling state of the bus bar 20 has a defect by comparing the voltage itself of both ends of the bus bar 20 with a reference voltage, although the determination for a coupling defect of the bus bar 20 have been conducted by calculating the resistance of the bus bar 20 from the voltages of both ends of the bus bar 20 and then comparing the resistance calculated with a reference value in the embodiment described above. For example, in the condition that a 10 A current constantly flows in the bus bar 20 and a reference voltage ranges from 500 to 700 V, if a voltage measured in both ends of the bus bar 20 exceeds the range of the reference voltage, the controlling unit 120 may determine a defect in the coupling state of the bus bar 20 because the resistance change may be estimated on the basis of the voltage change in a constant current.

Such a controlling unit 120, which determines whether the coupling state of the bus bar has a defect 20 on the basis of the variation of the coupling state detected by the coupling detection unit 110, may comprise a battery management system (BMS). The term BMS used herein means a battery managing system provided in a battery pack to control overall charging/discharging operation of the battery. However, the present invention is not limited to such a means for carrying out the controlling unit 120, and the controlling unit 120 may be constructed independent of the BMS.

Also, if the controlling unit 120 determines that the coupling state of the bus bar 20 has a defect, the charge/discharge current of the battery modules 10 may be interrupted to stop the use of the battery pack. If the battery pack is continuously used in the coupling defection state of the bus bar 20, the battery pack may be subject to the performance degradation thereof due to heat generation and, in a severe case, the ignition or explosion thereof. Accordingly, the controlling unit 120 can interrupt the charge/discharge current of the battery modules 10 to stop the use of the battery pack so as to prevent the coupling defect of the bus bar 20 to undergo more severe problems. Here, the interruption of the charge/discharge current of the battery modules 10 may be conducted in various manners, for example, by melting a fuse positioned on the charging/discharging path of the battery pack or allowing a charging/discharging switch to be off.

Meanwhile, the use of the battery pack is stopped as described above, such a state information may be provided to a user before or after stopping the use of the battery pack.

Also, as shown in FIG. 1, the battery pack managing apparatus according to one embodiment of the present invention may further comprise a memory unit 140.

The memory unit 140 may store all kinds of data necessary for conducting the functions of each component of the battery pack managing apparatus, i.e., a coupling detection unit 110, a controlling unit 120, etc. For example, the memory unit 140 may store data on a reference pressure if the coupling defect of the bus bar 20 is determined by the controlling unit 120 on the basis of a pressure detected by the pressure sensor 111. Also, the memory unit 140 may store data on a reference voltage or a current flowing in the bus bar 20 if the coupling defect of the bus bar 20 is determined by the controlling unit 120 on the basis of a voltage detected by the voltage sensor 112.

Also, the battery pack managing apparatus according to one embodiment of the present invention may further comprise a warning unit 130.

The warning unit 130 informs a user of the coupling defect of the bus bar 20 when the coupling defect of the bus bar 20 is determined by the controlling unit 120. For this information provision, the warning unit 130 may have a warning lamp, a display device such as a LCD monitor or a speaker. For example, in the case of the battery managing apparatus for vehicles, when there is a coupling defect of the bus bar 20 in the battery pack for vehicles, the warning unit 130 may inform a driver of the coupling defect of the bus bar 20 through a LCD monitor and a speaker equipped in a driving seat. Then, the driver can recognize a need for the maintenance, repair and exchange of the battery pack through the warning information and take suitable action.

The battery pack according to the present invention comprises the battery pack managing apparatus described above. That is, the battery pack may comprise a coupling detection unit 110 for detecting the coupling state of the bus bar and a controlling unit 120 for determining whether the coupling state of the bus bar has a defect on the basis of the coupling state detected by the coupling detection unit 110. Particularly, the battery pack managing apparatus described above is preferably used as a battery pack for electric vehicles.

The vehicle according to the present invention comprises the battery pack managing apparatus described above. Particularly, the vehicle including the battery pack managing apparatus according to the present invention may be an electric vehicle.

Meanwhile, in embodiments of FIGS. 1 to 5, for the convenience of explanation, two battery modules 10 are shown to be connected to each other. However, battery modules having three or more connections may also be applied in the present invention, which is apparent to those of ordinary skill in the art.

Figure 6:
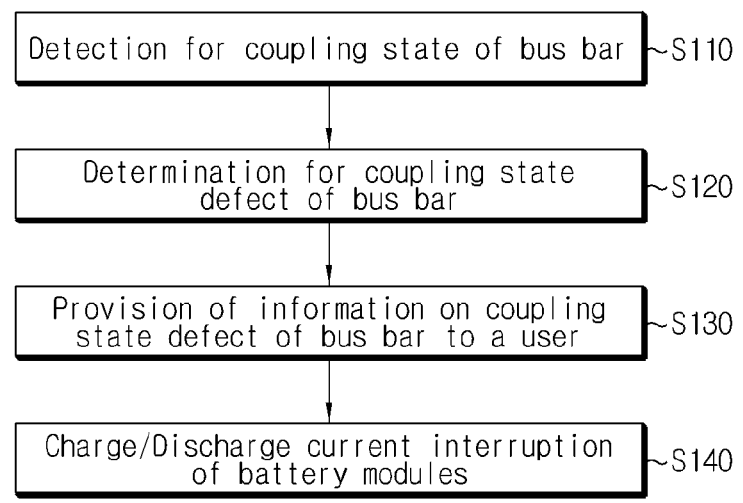
FIG. 6 is a flow chart schematically illustrating a method for managing a battery pack according to one embodiment of the present invention.

FIG. 6 is a flow chart schematically illustrating a method for managing a battery pack according to one embodiment of the present invention. Each step of FIG. 6 may be carried out by each component of the battery pack managing apparatus described above.

Referring to FIG. 6, in order to manage the battery pack according to the present invention, the bus bar 20, which is coupled with the battery modules 10 therebetween to electrically connect a plurality of the battery modules 10 with each other, is detected for its coupling state (S110). Here, step S110 may be conducted by a pressure sensor 111. The pressure sensor 111 may be a thin film-type. Also, step S110 may be conducted by a voltage sensor 112.

According to the detection results for the coupling state of the bus bar 20 to the battery modules 10, the bus bar 20 is determined to have a defect or no defect in its coupling state (S120). At this time, in the case that step S110 is conducted by a pressure sensor 111, the bus bar 20 may be determined to have a defect in its coupling state in step S120 when a pressure detected by the pressure sensor 111 is lower than a reference pressure value. Also, in the case that step S110 is conducted by a voltage sensor 112, the bus bar 20 may be determined to have a defect in its coupling state in step S120 when the resistance of the bus bar 20, which is calculated from a voltage detected by the voltage sensor 112, is higher than a reference resistance value.

Preferably, if the bus bar 20 is determined to have a defect in its coupling state in step S120, the battery pack managing method of the present invention may further comprise the step of informing the coupling defect of the bus bar to a user (S130).

Also, if the bus bar 20 is determined to have a defect in its coupling state in step S120, the battery pack managing method may further comprise the step of interrupting the charge/discharge current of the battery modules 10 (S140).

Meanwhile, step S120 may be conducted by a BMS.

Also, the steps of S110 to S140 are preferably applied in a battery pack for vehicles.

INDUSTRIAL APPLICABILITY

The present disclosure has been described in detail. However, it should be understood that the detailed description, specific examples and drawings, while indicating preferred embodiments of the disclosure, are given by way of illustration only, since various changes and modifications within the spirit and scope of the disclosure will become apparent to those skilled in the art from this detailed description.

Meanwhile, the term 'unit' used herein just represents a logic unit, which may not be a component that can be physically separated, which is apparent to those of ordinary skill in the art.

What is claimed is:

1. An apparatus for managing a battery pack having a plurality of battery modules and a bus bar coupled between the battery modules to electrically connect the battery modules, the apparatus comprising:
   a coupling detection unit configured to detect the coupling state of the bus bar to the battery modules, wherein the coupling detection unit includes a voltage sensor for measuring the voltage at both ends of the bus bar; and
   a controlling unit configured to:
      determine whether the coupling state of the bus bar has a defect on the basis of the coupling state detected by the coupling detection unit, and
      determine that the coupling state of the bus bar has a defect when a voltage at both ends of the bus bar measured by the voltage sensor exceeds a reference voltage range.

2. The apparatus for managing a battery pack according to claim 1, wherein the coupling detection unit comprises a pressure sensor.

3. The apparatus for managing a battery pack according to claim 2, wherein the pressure sensor is a thin film-type pressure sensor.

4. The apparatus for managing a battery pack according to claim 2, wherein the controlling unit determines that the coupling state of the bus bar has a defect when a pressure detected by the pressure sensor is lower than a reference pressure.

5. The apparatus for managing a battery pack according to claim 1, wherein the controlling unit determines that the coupling state of the bus bar has a defect when a resistance of the bus bar calculated from a voltage detected by the voltage sensor is higher than a reference resistance.

6. The apparatus for managing a battery pack according to claim 1, further comprising a warning unit for informing a user that the coupling state of the bus bar has a defect, when the controlling unit determines that the coupling state of the bus bar has a defect.

7. The apparatus for managing a battery pack according to claim 1, wherein the controlling unit interrupts a charge/discharge current of the battery modules when it has been determined that the coupling state of the bus bar has a defect.

8. The apparatus for managing a battery pack according to claim 1, wherein the controlling unit comprises a battery management system (BMS).

9. The apparatus for managing a battery pack according to claim 1, wherein the battery pack is used for vehicles.

10. A battery pack comprising the apparatus for managing a battery pack according to claim 1.

11. A vehicle comprising the apparatus for managing a battery pack according to claim 1.

12. A method for managing a battery pack having a plurality of battery modules and a bus bar coupled between the battery modules to electrically connect the battery modules, the method comprising:
   detecting the coupling state of the bus bar; and
   determining whether the coupling state of the bus bar has a defect on the basis of the coupling state of the bus bar detected,
   wherein the detection step for the coupling state of the bus bar is conducted by a voltage sensor for measuring the voltage at both ends of the bus bar, and, in the defect-determination step, it is determined that the coupling state of the bus bar has a defect when a voltage at both ends of the bus bar measured by the voltage sensor exceeds a reference voltage range.

13. The method for managing a battery pack according to claim 12, wherein the detection step for the coupling state of the bus bar is conducted by a pressure sensor.

14. The method for managing a battery pack according to claim 13, wherein the pressure sensor is a thin film-type pressure sensor.

15. The method for managing a battery pack according to claim 13, wherein the coupling state of the bus bar is determined to have a defect in the defect-determination step when a pressure detected by the pressure sensor is lower than a reference pressure.

16. The method for managing a battery pack according to claim 12, wherein the coupling state of the bus bar is determined to have a defect in the defect-determination step when a resistance of the bus bar calculated from a voltage detected by the voltage sensor is higher than a reference resistance.

17. The method for managing a battery pack according to claim 12, further comprising the step of informing that the coupling state of the bus bar has a defect, when the coupling state of the bus bar is determined to have a defect in the defect-determination step.

18. The method for managing a battery pack according to claim 12, further comprising the step of interrupting a charge/discharge current of the battery modules when the coupling state of the bus bar is determined to have a defect in the defect-determination step.

19. The method for managing a battery pack according to claim 12, wherein the defect-determination step for the coupling state of the bus bar is conducted by a battery management system (BMS).

20. The method for managing a battery pack according to claim 12, wherein the battery pack is used for vehicles.

* * * * *

UNITED STATES PATENT AND TRADEMARK OFFICE
CERTIFICATE OF CORRECTION

| | | |
|---|---|---|
| PATENT NO. | : 9,112,216 B2 | Page 1 of 1 |
| APPLICATION NO. | : 13/552116 | |
| DATED | : August 18, 2015 | |
| INVENTOR(S) | : Kyu-Ha Park | |

It is certified that error appears in the above-identified patent and that said Letters Patent is hereby corrected as shown below:

ON THE TITLE PAGE:

Please insert the following Item (63):

-- Related U.S. Application Data

(63) Continuation of application No. PCT/KR2011/009953, filed on Dec. 21, 2011. --

Signed and Sealed this
Nineteenth Day of July, 2016

Michelle K. Lee
*Director of the United States Patent and Trademark Office*